United States Patent [19]

Yamada et al.

[11] Patent Number: 5,323,027
[45] Date of Patent: Jun. 21, 1994

[54] LIGHT EMITTING DEVICE WITH DOUBLE HETEROSTRUCTURE

[75] Inventors: Masato Yamada; Takao Takenaka, both of Annaka, Japan

[73] Assignee: Shin-Etsu Handotai Kabushiki Kaisha, Tokyo, Japan

[21] Appl. No.: 889,372

[22] Filed: May 29, 1992

[30] Foreign Application Priority Data

May 31, 1991 [JP] Japan .................. 3-157651

[51] Int. Cl.$^5$ ........................................... H01L 33/00
[52] U.S. Cl. .......................... 257/94; 257/96; 257/97; 257/101; 372/43; 372/44; 372/45
[58] Field of Search .............. 257/96, 97, 101, 94; 372/43, 44, 45

[56] References Cited

FOREIGN PATENT DOCUMENTS 0301893 2/1989 European Pat. Off. .
0356037 2/1990 European Pat. Off. .

OTHER PUBLICATIONS

Watanabe et al., "Optical Tristability Using a Twin-Stripe Laser Diode," *Applied Physics Letters*, vol. 50, No. 8, Feb. 23, 1987, pp. 427–429.

Primary Examiner—William Mintel
Attorney, Agent, or Firm—Ronald R. Snider

[57] ABSTRACT

In a light emitting device comprising a first clad layer composed of a mixed crystal compound semiconductor of first type conductivity, an active layer composed of a mixed crystal compound semiconductor of first type conductivity which has the mixed crystal ratio required to emit the prescribed wavelength, and a second clad layer composed of a mixed crystal compound semiconductor of second type conductivity which has a mixed crystal ratio equivalent to that of the first clad layer, the active layer is sandwiched by the first and second clad layers and forms the double hetero structure with the first and second clad layers, and the carrier concentration in the first clad layer near the junction with the active layer was made to be $5 \times 10^{16}$ cm$^{-3}$ or less. The carrier concentration in the active layer is preferably $1 \times 10^{17}$ cm$^{-3}$ or less, and the carrier concentration in the second clad layer is preferably $5 \times 10^{16}$ cm$^{-3}$ or more.

66 Claims, 5 Drawing Sheets

LIGHT EMITTING DEVICE WITH DOUBLE HETEROSTRUCTURE

FIELD OF THE INVENTION

This invention relates to light emitting devices, and in particular to light emitting devices with a double hetero structure.

BACKGROUND OF THE INVENTION

A light emitting device is a semiconductor device which emits visible or infrared light when a forward direction current is applied to its pn junction. It is used as a point light source for a pilot lamp and such, and also as a light source in optical communications, and its applications are increasing.

In general, a light emitting device has a three-layer double hetero structure in which an active layer is sandwiched by a set of clad layers, and electrodes are formed on both sides of this double hetero structure to obtain a light emitting device. Each of the three layers is composed of a semiconductor, for which mainly the III-V group compound semiconductors are currently used commercially. Of these, the GaAlAs semiconductors are used for light emitting devices for high luminance applications because they provide higher luminance.

The light emitting devices described above are made, for example, by growing a three-layer double hetero structure on a GaAs substrate using the epitaxial growth method. Either the gas phase growth method or the liquid phase growth method may be employed. However, the liquid phase growth method is mostly used because it provides growth layers with better crystallinity.

As the applications for light emitting devices broaden, light emitting devices with higher luminance are increasingly desired. However, the conventional light emitting devices described above cannot provide enough luminance, and development of light emitting devices with higher luminance has been desired.

SUMMARY OF THE INVENTION

Accordingly, it is an object of this invention to provide light emitting devices with higher luminance than conventional light emitting devices.

According to this invention, a light emitting device comprises three layers which are:
(a) a first clad layer composed of a mixed crystal compound semiconductor of first type conductivity;
(b) an active layer composed of a mixed crystal compound semiconductor of first type conductivity which has the mixed crystal ratio required to emit light having the prescribed wavelength; and
(c) a second clad layer composed of a mixed crystal compound semiconductor of second type conductivity which has a mixed crystal ratio equivalent to that of the first clad layer;
wherein the active layer is sandwiched by the first and second clad layers and forms the double hetero structure with the first and second clad layers; and the device is characterized by the carrier concentration in the first clad layer near the junction with the active layer being $5 \times 10^{16}$ cm$^{-3}$ or less.

The carrier concentration of the active layer is preferably $1 \times 10^{17}$ cm$^{-3}$ or less, and the carrier concentration in the second clad layer near the junction with the active layer is preferably $5 \times 10^{16}$ cm$^{-3}$ or more. Also, the lower limits of the carrier concentration in the first clad layer near the junction with the active layer and the concentration of the active layer are set such that the first type conductivity is maintained. The upper limit of the carrier concentration of the second clad layer is set such that the added impurity does not deteriorate the crystallinity. As the impurity for the active layer and the first clad layer, Zn or C, for example, is chosen. There may be carried out a plural doping in which more than two impurities are doped thereto. As the impurity for the second clad layer, Te or Sn, for example, is chosen. There may be also carried out the plural doping.

The first and second clad layers may be composed of a mixed crystal type compound semiconductor represented as $Ga_{1-x}Al_xAs$ (where $0<x<1$). The active layer may be composed of a mixed crystal type compound semiconductor represented as $Ga_{1-y}Al_yAs$ (where $0<y<1$). Here, x is preferably between 0.6 and 0.85 and y is preferably between 0.3 and 0.45.

In this invention, the luminance of the light emitting device is improved by making the carrier concentration in the first clad layer near the active layer $5 \times 10^{16}$ cm$^{-3}$ or less. In the past, the carrier concentration in this clad layer was usually $5 \times 10^{16}$ cm$^{-3}$ or more. However, as described above, the inventors of the invention have confirmed that the luminance of a light emitting device increases under conditions in which the carrier concentration near the active layer is $5 \times 10^{16}$ cm$^{-3}$ or less. It is thought that the reason for this is that lowering the added impurity concentration near the active layer has greater positive effects from reduced crystal defects than negative effects from a reduction of the carriers and such, resulting in the increase in luminance.

BRIEF DESCRIPTION OF THE DRAWINGS

This invention will be explained in more detail in conjunction with appended drawings, wherein.

DESCRIPTION OF THE PREFERRED EMBODIMENT

An embodiment of this invention is described below by referring to the attached drawings.

Figure 1:
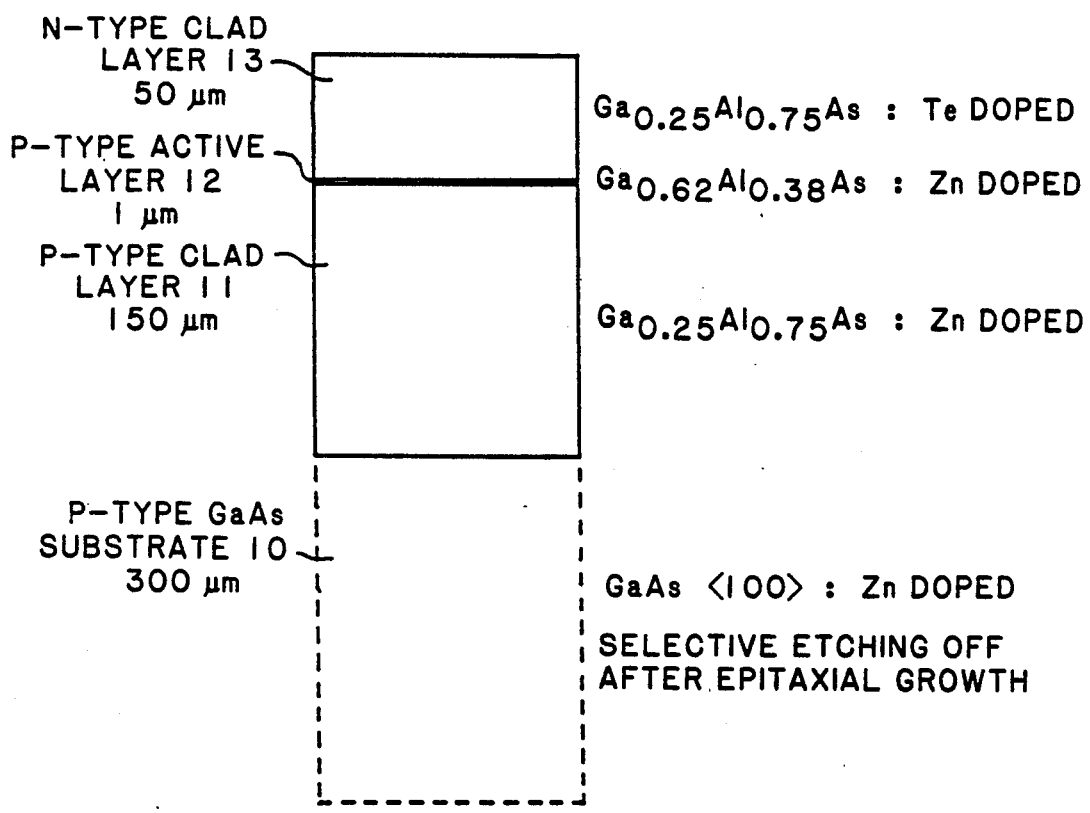
FIG. 1 is an explanatory view showing the depth-wise structure of the light emitting device in a preferred embodiment according to the invention.
Figure 2A:
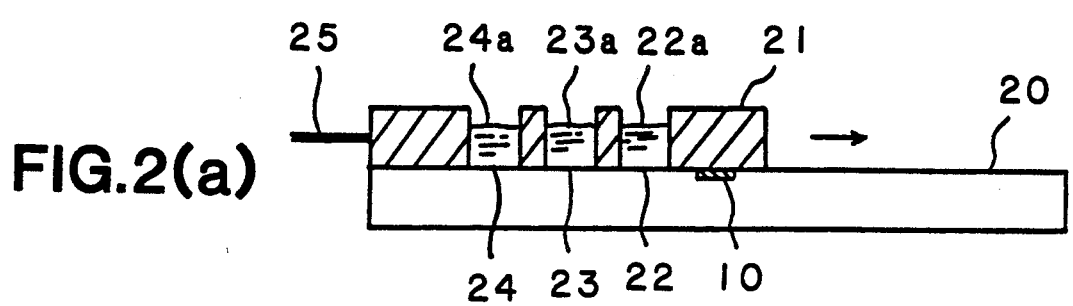
FIGS. 2(a)-2(e) are explanatory views showing an example of methods of fabricating the light emitting device in the preferred embodiment according to the invention.
Figure 2B:
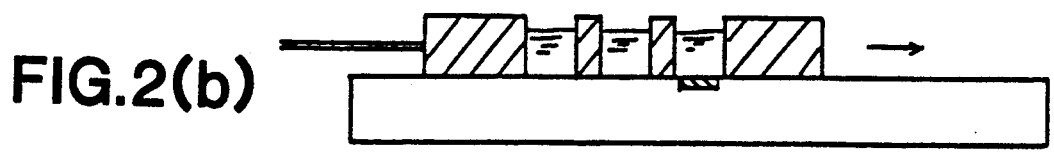
Figure 2C:
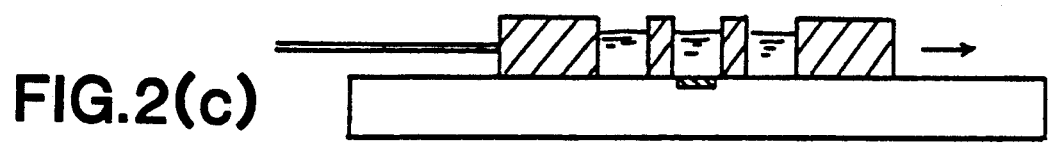
Figure 2D:
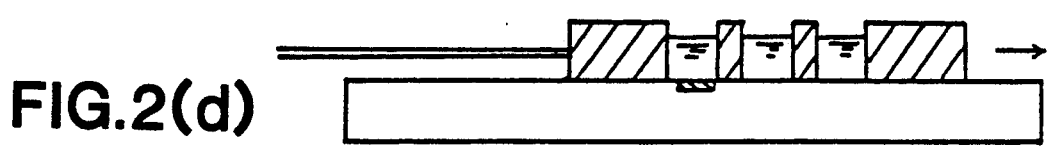
Figure 2E:
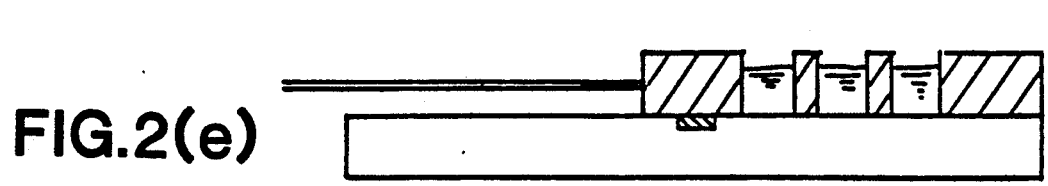

FIG. 1 is a cross-sectional view showing the depth-wise structure of an embodiment of the light emitting device of this invention. In this figure, the three layers of the epitaxial growth layers composing the light emitting device of this invention are formed on the p-type GaAs <100> substrate 10 with the added Zn concentration of approximately 1 to $3 \times 10^{19}$ cm$^{-3}$ as the impurity. The p-type clad layer 11 of 150 μm thickness composed of $Ga_{0.25}Al_{0.75}As$ mixed crystal compound semiconductor doped with Zn as the impurity to have the prescribed depth-wise profile, the p-type active layer 12 of 1 μm thickness composed of $Ga_{0.62}Al_{0.38}As$ mixed crystal compound semiconductor doped with Zn as the impurity to have the prescribed concentration, and the p-type clad layer 13 of 50 μm thickness composed of $Ga_{0.25}Al_{0.75}As$ mixed crystal compound semiconductor doped with Te as the impurity are consecutively formed on the p-type GaAs substrate 10 by the epitaxial growth method. The p-type GaAs substrate 10 will be removed by selective etching after the formation of the epitaxial growth layer described above.

Now we will describe an example of the manufacturing methods of the light emitting device of this embodiment by referring to FIG. 2. The light emitting device of this embodiment may be manufactured by growing each layer using the liquid phase growth method. Here, an example of the slide-boat method using a slide-boat is shown. Also shown is the gradual cooling method in which the growing is conducted by lowering the temperature gradually.

In FIG. 2, the p-type GaAs substrate 10 is secured on a boat body 20 in such way that its top surface is flush with the top surface of the boat body 20. The first solution reservoir 22 which contains the p-type clad layer growth solution 22a, the second solution reservoir 23 which contains the p-type active layer growth solution 23a, and the third solution reservoir 24 which contains the n-type clad layer growth solution 24a are set up on the sliding solution reservoir 21. Each solution reservoir does not have a bottom, so that each solution directly soaks the top surface of the boat body 20. The p-type and n-type clad layer growth solutions 22a and 24a are melted $Ga_{0.25}Al_{0.75}As$ liquid with Zn added as the p-type impurity and Te added as the n-type impurity, respectively. The p-type active layer growth solution 23a is melted $Ga_{0.62}Al_{0.38}As$ liquid with Zn added as the p-type impurity. The sliding solution reservoir 21 is moved by a handling rod 25.

Now, we describe the process using the equipment described above to form the three epitaxial growth layers on the p-type GaAs substrate 10. First, using the handling rod 25, the sliding solution reservoir 21 is slid, in the direction of the arrow, from the position indicated in FIG. 2(a) to set the p-type clad layer growth solution 22a in the first reservoir 22 on the p-type GaAs substrate 10, and the p-type clad layer 11 is grown under the conditions where, for example, the temperature is lowered from 900° C. to 800° C. (FIG. 2(b)). Then, the sliding solution reservoir 21 is slid further in the direction of the arrow to set the p-type active layer growth solution 23a in the second reservoir 23 on the p-type GaAs substrate 10, and the p-type active layer is grown under the conditions where, for example, the temperature is lowered from 800° C. to 795° C. (FIG. 2(c)). The sliding solution reservoir 21 is slid further in the direction of the arrow to grow the n-type clad layer 13 under the conditions where, for example, the temperature is lowered from 795° C. to 650° C. (FIG. 2(d)). After this, the sliding solution reservoir 21 is slid further in the direction of the arrow to complete the growth process (FIG. 2(e)).

In order to keep the carrier concentration in the p-type clad layer 11 near the active layer at $5 \times 10^{16}$ cm$^{-3}$ or less, the amount of the p-type impurity Zn added to the p-type clad layer growth solution 22a is very small, or Zn is not added at all. However, in the subsequent thermal process, the highly concentrated Zn added to the p-type GaAs substrate 10 diffuses into the clad layer, causing so-called "auto doping". As a result, the clad layer becomes the p-type clad layer 11 with the prescribed concentration profile, and an area with low carrier concentration ($1 \times 10^{16}$ cm$^{-3}$) is formed near the p-type active layer 12.

After forming the three layer double hetero structure on the p-type GaAs substrate 10, as described above, the substrate is removed by etching and electrodes are formed on both sides of the three layer structure to obtain the light emitting device.

Figure 3:
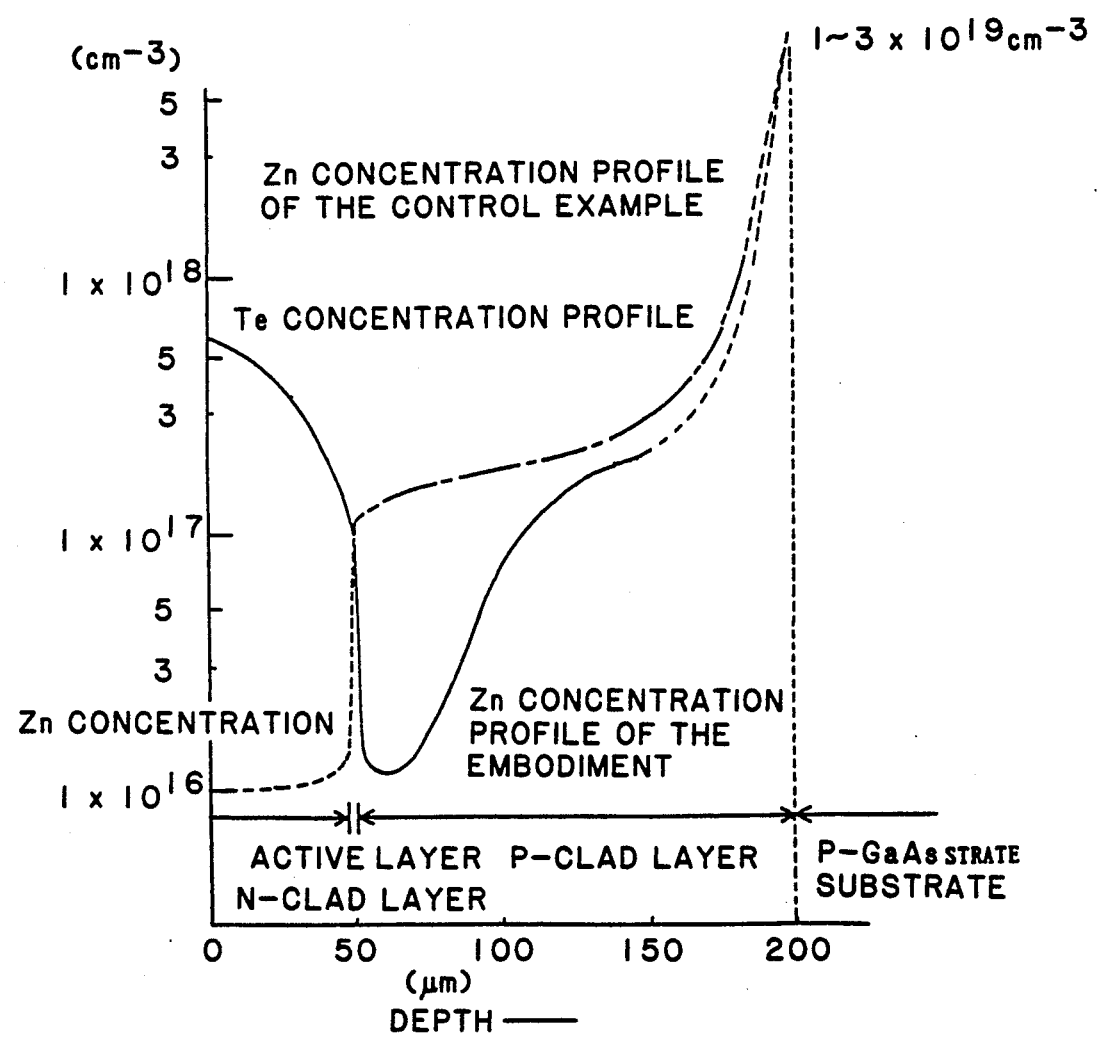
FIG. 3 is a graph showing the depth-wise carrier concentration profile of the light emitting device in the preferred embodiment according to the invention.

FIG. 3 shows a depth-wise carrier concentration profile of the light emitting device of this embodiment which was made as described above. The carrier concentration in the p-type clad layer 11 near the p-type GaAs substrate 10 is approximately equivalent to the carrier concentration in the substrate (1 to $3 \times 10^{19}$ cm$^{-3}$). However, the closer to the p-type active layer 12, the lower the carrier concentration, and it is as low as $1 \times 10^{16}$ cm$^{-3}$ near the junction with the p-type active layer. On the other hand, the carrier concentration in the p-type active layer is $1 \times 10^{17}$ cm$^{-3}$. The carrier concentration in the n-clad layer 13 increases from $1 \times 10^{17}$ cm$^{-3}$, which is equivalent to the carrier concentration in the p-type active layer, to approximately $6 \times 10^{17}$ cm$^{-3}$ in the top region.

Figure 4:
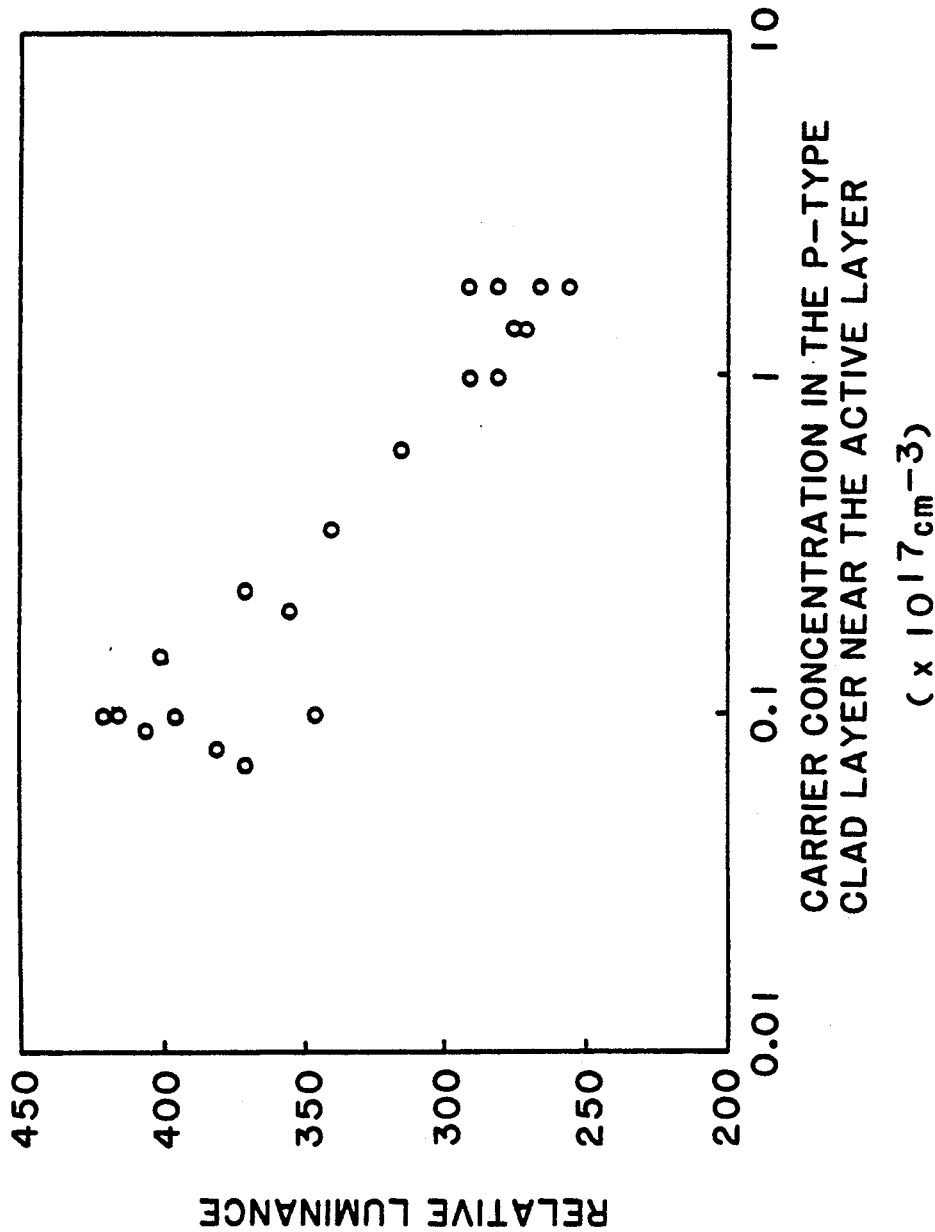
FIG. 4 is a graph showing the relationship between the carrier concentration in the p-type clad layer near the active layer and the relative luminance of the light emitting device.
Figure 5:
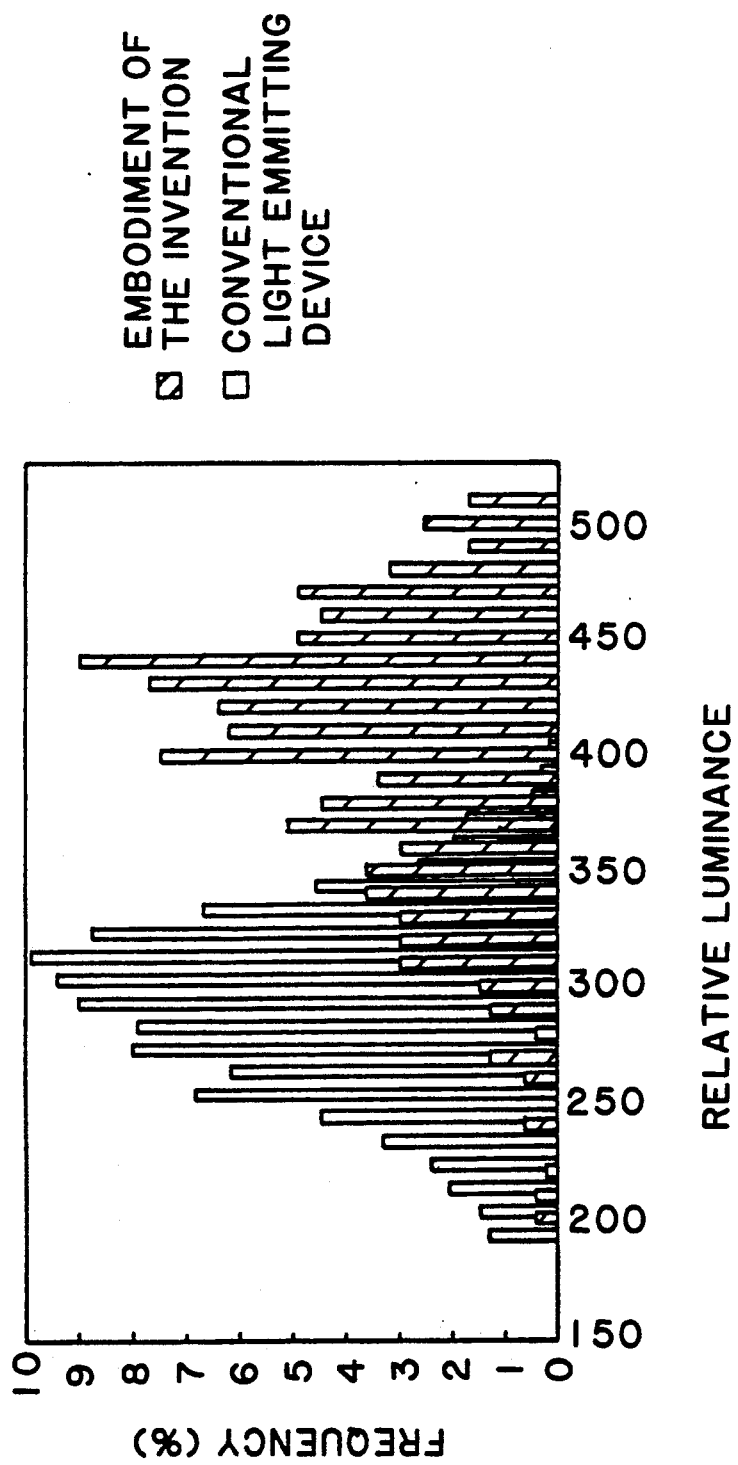
FIG. 5 is a graph showing the frequency distribution by relative luminance for the concentration range in the preferred embodiment according to the invention (1 to $2 \times 10^{16}$ cm$^{-3}$) and the distribution for the conventional concentration range (1 to $2 \times 10^{17}$ cm$^{-3}$).

FIG. 4 shows the relationship between the carrier concentration in the p-type clad layer 11 near the p-type active layer 12 and the relative luminance of the light emitting device. It is shown that as the carrier concentration in the p-type clad layer 11 near the p-type active layer 12 decreases, the relative luminance of the light emitting device increases. FIG. 5 shows the frequency distribution by relative luminance for the concentration range in the embodiment of this invention (1 to $2 \times 10^{16}$ cm$^{-3}$) and the distribution for the conventional concentration range (1 to $2 \times 10^{17}$ cm$^{-3}$). It is shown that the relative luminance for the concentration range in this embodiment (1 to $2 \times 10^{16}$ cm$^{-3}$) is very high, approximately 400.

As described above, in a light emitting device comprising three layers, i.e., (a) a first clad layer composed of a mixed crystal compound semiconductor of first type conductivity, (b) an active layer composed of a mixed crystal compound semiconductor of first type conductivity which has the mixed crystal ratio required to emit the prescribed wavelength, and (c) a second clad layer composed of a mixed crystal compound semiconductor of second type conductivity which has a mixed crystal ratio equivalent to that of the first clad layer, wherein the active layer is sandwiched by the first and second clad layers and forms the double hetero structure with the first and second clad layers, it is possible to obtain higher luminance than that of conventional light emitting devices by keeping the carrier concentration in the first clad layer near the junction with the active layer at $5 \times 10^{16}$ cm$^{-3}$ or less.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A light emitting device, comprising:

a first clad layer composed of a mixed crystal compound semiconductor of a first type conductivity;

an active layer composed of a mixed crystal compound semiconductor of the first type conductivity which has a mixed crystal ratio required to emit the prescribed wavelength; and a second clad layer composed of a mixed crystal compound semiconductor of a second type conductivity which has a mixed crystal ratio equivalent to that of said first clad layer;

wherein said active layer is sandwiched by said first and second clad layers and forms a double heterostructure with said first and second clad layers; and a carrier concentration in said first clad layer near the junction with said active layer is substantially less than $5 \times 10^{16}$ cm$^{-3}$.

2. A light emitting device in accordance with claim 1, wherein:

a carrier concentration in said active layer is $1 \times 10^{17}$ cm$^{-3}$ or less.

3. A light emitting device in accordance with claim 1, wherein:

a carrier concentration in said second clad layer near the junction with said active layer is $5 \times 10^{16}$ cm$^{-3}$ or more.

4. A light emitting device in accordance with claim 1, wherein:

a carrier concentration in said active layer is $1 \times 10^{17}$ cm$^{-3}$ or less; and a carrier concentration in said second clad layer near the junction with said active layer is $5 \times 10^{16}$ cm$^{-3}$ or more.

5. A light emitting device in accordance with claim 1, wherein:

an impurity added to said active layer and said first clad layer is an impurity selected from zinc (Zn) and carbon (C).

6. A light emitting device in accordance with claim 1, wherein:

a carrier concentration of said active layer is $1 \times 10^{17}$ cm$^{-3}$ or less; and an impurity added to said active layer and said first clad layer is an impurity selected from zinc (Zn) and carbon (C).

7. A light emitting device in accordance with claim 1, wherein:

a carrier concentration in said second clad layer near the junction with said active layer is $5 \times 10^{16}$ cm$^{-3}$ or more; and an impurity added to said active layer and said first clad layer is an impurity selected from zinc (Zn) and carbon (C).

8. A light emitting device in accordance with claim 1, wherein:

a carrier concentration of said active layer is $1 \times 10^{17}$ cm$^{-3}$ or less;

a carrier concentration is said second clad layer near the junction with said active layer is $5 \times 10^{16}$ cm$^{-3}$ or more; and an impurity added to said active layer and said first clad layer is an impurity selected from zinc (Zn) and carbon (C).

9. A light emitting device comprising:

a first clad layer composed of a mixed crystal compound semiconductor represented as $Ga_{1-x}Al_xAs$ (where $0<x<1$) of first type conductivity;

an active layer composed of a mixed crystal compound semiconductor represented as $Ga_{1-y}Al_yAs$ (where $0<y<1$) of first type of conductivity; and a second clad layer composed of a mixed crystal compound semiconductor of second type conductivity which has a mixed crystal ration equivalent to that of said clad layer;

wherein said active layer is sandwiched by said first and second clad layers and forms a double heterostructure with said first and second clad layers; and the carrier concentration in said first clad layer near the junction with said active layer is substantially less than $5 \times 10^{16}$ cm$^{-3}$.

10. A light emitting device in accordance with claim 9, wherein:

a carrier concentration of said active layer is $1 \times 10^{17}$ cm$^{-3}$ or less.

11. A light emitting device in accordance with claim 9, wherein:

a carrier concentration of said second clad layer near the junction with said active layer is $5 \times 10^{16}$ cm$^{-3}$ or more.

12. A light emitting device in accordance with claim 9, wherein:

a carrier concentration of said active layer is $1 \times 10^{17}$ cm$^{-3}$ or less; and a carrier concentration in said second clad layer near the junction with said active layer is $5 \times 10^{16}$ cm$^{-3}$ or more.

13. A light emitting device in accordance with claim 9, wherein:

an impurity added to said active layer and said first clad layer is an impurity selected from zinc (Zn) and carbon (C).

14. A light emitting device in accordance with claim 9, wherein:

a carrier concentration of said active layer is $1 \times 10^{17}$ cm$^{-3}$ or less; and an impurity added to said active layer and said first clad layer is an impurity selected from zinc (Zn) and carbon (C).

15. A light emitting device in accordance with claim 9, wherein:

a carrier concentration in said second clad layer near the junction with said active layer is $5 \times 10^{16}$ cm$^{-3}$ or more; and an impurity added to said active layer and said first clad layer is an impurity selected from zinc (Zn) and carbon (C).

16. A light emitting device in accordance with claim 9, wherein:

a carrier concentration of said active layer is $1 \times 10^{17}$ cm$^{-3}$ or less;

a carrier concentration in said second clad layer near the junction with said active layer is $5 \times 10^{16}$ cm$^{-3}$ or more; and an impurity added to said active layer and said first clad layer is an impurity selected from zinc (Zn) and carbon (C).

17. A light emitting device, according to claim 9: wherein said x is between 0.6 and 0.85, and said y is between 0.3 and 0.45.

18. A light emitting device, according to claim 10: wherein said x is between 0.6 and 0.85, and said y is between 0.3 and 0.45.

19. A light emitting device, according to claim 11: wherein said x is between 0.6 and 0.85, and said y is between 0.3 and 0.45.

20. A light emitting device, according to claim 12: wherein said x is between 0.6 and 0.85, and said y is between 0.3 and 0.45.

21. A light emitting device, according to claim 13: wherein said x is between 0.6 and 0.85, and said y is between 0.3 and 0.45.

22. A light emitting device, according to claim 14: wherein said x is between 0.6 and 0.85, and said y is between 0.3 and 0.45.

23. A light emitting device, according to claim 15: wherein said x is between 0.6 and 0.85, and said y is between 0.3 and 0.45.

24. A light emitting device, according to claim 16: wherein said x is between 0.6 and 0.85, and said y is between 0.3 and 0.45.

25. A light emitting device, according to claim 9: wherein the impurity added to said second clad layer is Te.

26. A light emitting device, according to claim 10: wherein the impurity added to said second clad layer is Te.

27. A light emitting device, according to claim 11: wherein the impurity added to said second clad layer is Te.

28. A light emitting device, according to claim 12: wherein the impurity added to said second clad layer is Te.

29. A light emitting device, according to claim 13: wherein the impurity added to said second clad layer is Te.

30. A light emitting device, according to claim 14: wherein the impurity added to said second clad layer is Te.

31. A light emitting device, according to claim 15: wherein the impurity added to said second clad layer is Te.

32. A light emitting device, according to claim 16: wherein the impurity added to said second clad layer is Te.

33. A light emitting device having a carrier concentration in a first clad layer near a junction with an active layer which is substantially less than $5 \times 10^{16}$ cm$^{-3}$, made by a process comprising the steps of:
sliding a first solution reservoir containing a p-type clad layer growth solution on a p-type gallium arsenide (GaAs) substrate;
growing a p-type clad layer when the temperature is lowered from 900° C. to 800° C.;
sliding a second solution reservoir containing a p-type active layer growth solution over said p-type gallium arsenide (GaAs) substrate;
growing a p-type active layer while lowering the temperature from 800° C. to 795° C.;
sliding a third solution reservoir containing an n-type clad layer growth solution over said p-type gallium arsenide (GaAs) substrate; and
growing an n-type clad layer while the temperature is lowered from 795° C. to 650° C.

34. A light emitting device in accordance with claim 33, wherein said process further comprises the step of sliding said third solution reservoir away from said n-type clad layer.

35. A light emitting device made by a process in accordance with claim 34, further comprising the step of selectively etching off of said p-type gallium arsenide (GaAs) substrate after epitaxial growth.

36. A light emitting device made by a process comprising the steps of:

(a) forming a first clad semiconductor layer on a semiconductor substrate layer which is doped with an impurity;
(b) diffusing said impurity from said first semiconductor substrate layer as an impurity source to said first clad semiconductor layer to have a predetermined carrier concentration profile, wherein a
carrier concentration in said first clad layer near the junction with said active layer is substantially less than $5 \times 10^{16}$ cm$^{-3}$.

37. A light emitting device in accordance with claim 36, wherein said first semiconductor layer is an epitaxial layer grown by epitaxy.

38. A light emitting device in accordance with claim 36, wherein each of said first clad second semiconductor layer and semiconductor substrate layer consists of a semiconductor included by the III-V periodical group.

39. A light emitting device in accordance with claim 36, wherein said first clad semiconductor layer is an epitaxial layer grown by epitaxy; and
each of said first clad semiconductor layer and said semiconductor substrate consist of a semiconductor included by the III-V periodical group.

40. A light emitting device in accordance with claim 36, wherein said semiconductor substrate consists of GaAs and said first clad semiconductor layer consists of GaAlAs.

41. A light emitting device in accordance with claim 36, wherein said semiconductor substrate layer is doped with Zn.

42. A light emitting device in accordance with claim 36, wherein said first clad semiconductor layer is an epitaxial layer grown by epitaxy; and
said semiconductor substrate layer is doped with Zn.

43. A light emitting device in accordance with claim 36, wherein each of said semiconductor substrate layer and first clad semiconductor layer consists of a semiconductor included by the III-V periodical group; and
said semiconductor substrate layer is doped with Zn.

44. A light emitting device in accordance with claim 36, wherein said semiconductor substrate layer consists of GaAs and said first clad semiconductor layer consists of GaAlAs; and
said semiconductor substrate layer is doped with Zn.

45. A light emitting device in accordance with claim 36, wherein said first clad semiconductor layer is an epitaxial layer grown by epitaxy;
each of said semiconductor substrate and first clad semiconductor layer consist of a semiconductor included by the III-V periodical group; and
said semiconductor substrate layer is doped with Zn.

46. A light emitting device in accordance with claim 36, wherein said first clad semiconductor layer is an epitaxial layer grown by epitaxy;
said semiconductor substrate layer consists of GaAs and said second semiconductor layer consists of GaAlAs; and
said semiconductor substrate layer is doped with Zn.

47. A light emitting device in accordance with claim 36, wherein said semiconductor substrate layer has a carrier concentration equal to or higher than $5 \times 10^{17}$ atoms cm$^{-3}$.

48. A light emitting device in accordance with claim 36, wherein said semiconductor substrate layer is doped with Zn; and
said semiconductor substrate layer has a carrier concentration equal to or higher than $5 \times 10^{17}$ atoms cm$^{-3}$.

49. A light emitting device in accordance with claim 36, wherein said step (b) of diffusing said impurity from said semiconductor substrate layer is carried out using heat generated in a step of forming said first clad semiconductor layer and/or other layers.

50. A light emitting device in accordance with claim 36, wherein a surface of said first clad semiconductor layer has a carrier concentration equal to or lower than $5 \times 10^{16}$ atoms cm$^{-3}$.

51. A light emitting device, comprising:
a first clad layer composed of a mixed crystal compound semiconductor of a first type conductivity;
an active layer composed of a mixed crystal compound semiconductor of the first type conductivity which has the mixed crystal ratio required to emit the prescribed wavelength; and
a second clad layer composed of a mixed crystal compound semiconductor of a second type conductivity which has a mixed crystal ratio equivalent to that of said first clad layer;
wherein said active layer is sandwiched by said first and second clad layers and forms a double heterostructure with said first and second clad layers;
a carrier concentration in said first clad layer near the junction with said active layer is substantially less than $5 \times 10^{16}$ cm$^{-3}$; and
wherein an impurity added to said first clad layer is an impurity comprising zinc (Zn) and carbon.

52. A light emitting device in accordance with claim 51, wherein a carrier concentration in said active layer is $1 \times 10^{17}$ cm$^{-3}$ or less.

53. A light emitting device in accordance with claim 51, wherein a carrier concentration in said second clad layer near the junction with said active layer is $5 \times 10^{16}$ cm$^{-3}$ or more.

54. A light emitting device in accordance with claim 51, wherein carrier concentration in said active layer is $1 \times 10^{17}$ cm$^{-3}$ or less; and
a carrier concentration in said second clad layer near the junction with said active layer is $5 \times 10^{16}$ cm$^{-3}$ or more.

55. A light emitting device comprising:
a first clad layer composed of a mixed crystal compound semiconductor represented as $Ga_{1-x}Al_xAs$ (where $0<x<1$) of a first type conductivity;
an active layer composed of a mixed crystal compound semiconductor represented as $Ga_{1-y}Al_yAs$ (where $0<y<1$) of said first type of conductivity;
a second clad layer composed of a mixed crystal compound semiconductor of a second type conductivity which has a mixed crystal ration equivalent to that of said clad layer;
wherein said active layer is sandwiched by said first and second clad layers and forms a double heterostructure with said first and second clad layers;
a carrier concentration in said first clad layer near the junction with said active layer is substantially less than $5 \times 10^{16}$ cm$^{-3}$; and
wherein an impurity added to said active layer is an impurity comprising zinc (Zn) and carbon.

56. A light emitting device in accordance with claim 55, wherein a carrier concentration of said active layer is $1 \times 10^{17}$ cm$^{-3}$ or less.

57. A light emitting device in accordance with claim 55, wherein a carrier concentration of said second layer near the junction with said active layer is $5 \times 10^{16}$ cm$^{-3}$ or more.

58. A light emitting device in accordance with claim 55, wherein:
a carrier concentration of said active layer is $1 \times 10^{17}$ cm$^{-3}$ or less; and
a carrier concentration in said second clad layer near the junction with said active layer is $5 \times 10^{16}$ cm$^{-3}$ or more.

59. A light emitting device in accordance with claim 55, wherein said x is between 0.6 and 0.85, and said y is between 0.3 and 0.45.

60. A light emitting device in accordance with claim 56, wherein said x is between 0.6 and 0.85, and said y is between 0.3 and 0.45.

61. A light emitting device in accordance with claim 57, wherein said x is between 0.6 and 0.85, and said y is between 0.3 and 0.45.

62. A light emitting device in accordance with claim 58, wherein said x is between 0.6 and 0.85, and said y is between 0.3 and 0.45.

63. A light emitting device in accordance with claim 55, wherein an impurity added to said second clad layer is Te.

64. A light emitting device in accordance with claim 56, wherein an impurity added to said second clad layer is Te.

65. A light emitting device in accordance with claim 57, wherein an impurity added to said second clad layer is Te.

66. A light emitting device in accordance with claim 58, wherein an impurity added to said second clad layer is Te.

* * * * *